United States Patent
DiBella et al.

(10) Patent No.: US 9,437,469 B2
(45) Date of Patent: Sep. 6, 2016

(54) INERTIAL WAFER CENTERING END EFFECTOR AND TRANSPORT APPARATUS

(75) Inventors: Anthony V. DiBella, Norwood, MA (US); Dennis Poole, Derry, NH (US); William Fosnight, Carlisle, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 1455 days.

(21) Appl. No.: 11/741,416

(22) Filed: Apr. 27, 2007

(65) Prior Publication Data

US 2008/0267747 A1 Oct. 30, 2008

(51) Int. Cl.
*H01L 21/68* (2006.01)
*H01L 21/687* (2006.01)

(52) U.S. Cl.
CPC .............. *H01L 21/68707* (2013.01)

(58) Field of Classification Search
USPC .......... 414/744.1, 744.5, 941; 248/276.1, 248/282.1, 289.11, 917, 222.13; 294/907, 294/902, 1.1; 901/30
See application file for complete search history.

(56) References Cited

U.S. PATENT DOCUMENTS

| | | | |
|---|---|---|---|
| 5,669,644 A | 9/1997 | Kaiholsu et al. | |
| 6,520,726 B1 | 2/2003 | Cook et al. | 414/217 |
| 6,678,581 B2 | 1/2004 | Hung et al. | 700/245 |
| 7,048,316 B1* | 5/2006 | Blank et al. | 294/1.1 |
| 7,233,842 B2* | 6/2007 | Bacchi et al. | 700/245 |
| 2003/0035711 A1* | 2/2003 | Gilchrist | 414/744.5 |
| 2003/0085582 A1* | 5/2003 | Woodruff et al. | 294/103.1 |
| 2004/0258514 A1 | 12/2004 | Raaijmakers | 414/935 |
| 2005/0265814 A1 | 12/2005 | Coady | 414/744.5 |
| 2006/0222480 A1 | 10/2006 | Duhamel et al. | 414/744.8 |
| 2007/0128008 A1* | 6/2007 | Morikawa | 414/217 |

FOREIGN PATENT DOCUMENTS

| | | |
|---|---|---|
| JP | 11330198 | 11/1999 |
| JP | 2000252347 | 9/2000 |
| JP | 2004273847 | 9/2004 |
| JP | 2004535681 | 11/2004 |
| JP | 2008235810 | 10/2008 |

* cited by examiner

*Primary Examiner* — Ernesto Suarez
*Assistant Examiner* — Brendan Tighe
(74) *Attorney, Agent, or Firm* — Perman & Green, LLP; Colin C. Durham

(57) ABSTRACT

A substrate transport apparatus for a processing tool. The apparatus has a drive section, a movable arm, and an end effector. The arm is operably connected to the drive section. The end effector is connected to the movable arm for holding and transporting the substrate in the processing tool. The apparatus has a substrate inertial capture edge grip connected to the end effector and arranged so that the grip effects capture and centering of the substrate onto the end effector from substrate inertia.

22 Claims, 13 Drawing Sheets

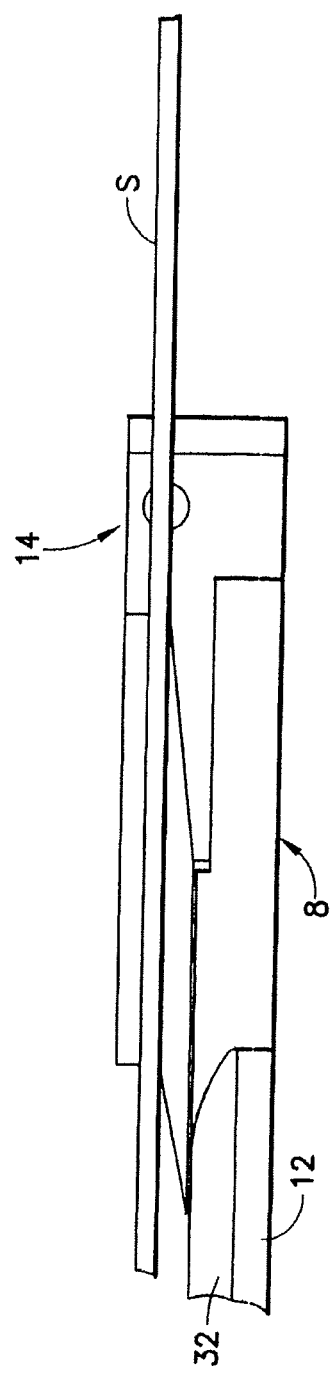

INERTIAL WAFER CENTERING END EFFECTOR AND TRANSPORT APPARATUS

FIELD

The present disclosure generally relates to a device for handling and transporting flat, thin work pieces. It more particularly relates to an end effector coupled to a substrate transport apparatus for handling and transporting semiconductor wafers. Still more particularly, the present disclosure relates to end effector having a passive edge grip for receiving, capturing, and centering a semiconductor wafer.

BACKGROUND

Integrated circuits are produced from wafers of semiconductor material. The wafers are typically housed in a cassette, that may be held in a carrier (e.g. FOUP, SMIF, etc.), having one or more closely spaced slots (as specified in SEMI standard), each of which can contain a wafer. The cassette is typically moved to a processing station where the wafers are removed from the cassette, placed in a predetermined orientation by a prealigner or otherwise processed, and returned to another location for further processing.

Various types of wafer handling devices are known for transporting the wafers to and from the cassette, within processing stations, and between processing stations. Many employ a robotic arm having an end effector that is inserted into the cassette to remove or insert a wafer. The end effector generally enters the cassette through the narrow gap between a pair of adjacent wafers and engages the backside of a wafer to retrieve it from the cassette. It is desired that, the end effector be thin, rigid, and positionable with high accuracy to fit between and not touch the closely spaced apart wafers in the cassette. After the wafer has been put through one or more processing steps, the robotic arm places the wafer back into the cassette.

Various means have been devised for centering and capturing a silicon wafer on the end effector. Some capture systems are active systems with one or more actuable components on the end effector. In one type of end effector, a series of vacuum suction pads or cups releasibly hold and center the wafer to the end effector. The suction pads or cups touch the back side of a wafer to mechanically secure it during handling. Touching the back side of the wafer is undesired as it may result in particulate matter contaminating the back of the wafer, and possibly falling onto processed surfaces of other stacked wafers (e.g. the transport). In another type of end effector, mechanical actuation through the use of hydraulically or pneumatically actuated arms or fingers are used to mechanically secure a wafer during handling. Typically, the actuated arms or fingers apply a compressive force to the perimeter of the wafer to center and capture it.

These mechanical actuation and vacuum-assisted devices and methods of centering and capturing silicon wafers on end effectors are complex from a design standpoint and therefore costly to build and maintain. In addition, the vacuum assisted method may cause backside damage to the wafer and contamination of the other wafers in the cassette because intentional engagement as well as inadvertent touching of the wafer may dislodge particles that can fall and settle onto the other wafers. Wafer backside damage can include scratches as well as metallic and organic contamination of the wafer material.

Mechanically actuated edge grip end effectors minimize the amount of particulate contamination and backside damage to the wafer, but however present difficulties in accurately picking, centering, capturing and transferring the wafer. Mechanically actuated edge grip end effectors also may damage the edge area of the end effector. Moreover mechanical actuators increase the complexity, weight and profile height of the end effector. Therefore end effectors with mechanical actuated wafer grips may be difficult to maneuver through vertical stacking cassettes where the wafers are stored because the separation between wafers is on the order of only about 5-10 mm as specified by SEMI. In addition, the contamination, scratching and damage to the wafers as a result of vacuum assisted and mechanically actuated end effector devices and methods described results in lower production yields and correspondingly higher manufacturing costs.

According, there is a need for an improved end effector coupled to a substrate transport apparatus that decreases contamination and damage to the wafer surfaces, decreases the design complexity of the apparatus, maximizes vertical clearances in the cassette, and more accurately and effectively centers and captures the wafer on the end effector.

SUMMARY

In accordance with an exemplary embodiment, a substrate transport apparatus for a processing tool is provided. The apparatus has a drive section, a movable arm, and an end effector. The arm is operably connected to the drive section. The end effector is connected to the movable arm for holding and transporting the substrate in the processing tool. The apparatus has a substrate inertial capture edge grip connected to the end effector and arranged so that the grip effects capture and centering of the substrate onto the end effector from substrate inertia.

In one exemplary embodiment, a substrate transport apparatus is provided for flat work pieces. The apparatus comprises a drive section including a drive shaft; a movable arm connected to the drive shaft; an end effector connected to the moveable arm, wherein the end effector includes asymmetric front and rear pads mounted to the end effector blade for supporting the perimeter of a flat work piece and a thru beam sensor mounted within the end effector blade for mapping, detecting and positioning the flat work piece on the front and rear pads; and a controller for coordinating the drive section, the moveable arm, the end effector and the thru beam sensor, wherein the end effector picks up the flat work piece in a skewed and eccentric position on the support surfaces of the front and rear pads, and then simultaneously centers and captures the flat work piece between the front and rear pads in a horizontal position via a lateral force provided by movement of the end effector.

In another exemplary embodiment, a substrate transport apparatus is provided for flat work pieces. The apparatus comprises a drive section including a drive shaft; two or more parallel movable arms connected to the drive shaft; two or more parallel end effectors connected to the two or more moveable arms, wherein the two or more parallel end effectors each include asymmetric front and rear pads mounted to an end effector blade for supporting the perimeter of a flat work piece and a thru beam sensor mounted within the end effector blade for mapping, detecting and positioning the flat work piece on the asymmetric front and rear pads; and one or more controllers for coordinating the drive section, the two or more parallel moveable arms, the two or more parallel end effectors and the thru beam sensors, wherein one or more of the parallel end effectors pick up one or more flat work pieces in a skewed and eccentric position on the support surfaces of the front and rear pads, and then simultaneously center and capture the one or more flat work pieces between the front and rear pads in a horizontal position via a lateral force provided by movement of the one or more parallel end effectors.

In still another exemplary embodiment, a method of transporting flat work pieces is provided. The method comprises providing a flat work piece transport apparatus comprising a drive shaft, a movable arm connected to the drive shaft, an end effector connected to the moveable arm, wherein the end effector includes asymmetric front and rear pads mounted to the end effector blade and a thru beam sensor mounted within the end effector blade, and a controller for coordinating the drive section, the moveable arm, the end effector and the thru beam sensor; mapping with the thru beam sensor the position of the flat work piece relative to the position of the front and rear pads of the end effector blade; picking up the flat work piece in a skewed and eccentric position on the support surfaces of the front and rear pads of the end effector blade; detecting an eccentricity of 1 mm or less of the flat work piece on the support surfaces of the front and rear pads with the thru beam sensor; and moving the end effector to provide a lateral force to the flat work piece to simultaneously center and capture the flat work piece between the front and rear pads in a horizontal position.

Numerous advantages result from the substrate transport apparatus and method of transporting flat work pieces disclosed herein and the uses/applications therefore.

BRIEF DESCRIPTION OF DRAWINGS

The foregoing aspects and other features of the present disclosure are explained in the following description, with reference to the accompanying drawings, in which:

FIG. 7B is a side design view of the end effector with a flat work piece and the thru beam sensor beam being interrupted by its presence.

DETAILED DESCRIPTION

The present disclosure relates to a substrate transport apparatus with an end effector for centering and capturing a silicon wafer. The end effector and substrate transport apparatus are distinguishable over the prior art in providing and utilizing an inertial capture edge grip with end effector pads that may pick up a substrate in a skewed eccentric position and subsequently center, make horizontal, and capture the flat work piece from inertial movement of the substrate. The end effector and substrate transport apparatus disclosed herein offer significant advantages relative to prior art end effectors and transport apparatus. As will be described further below.

Figure 1:
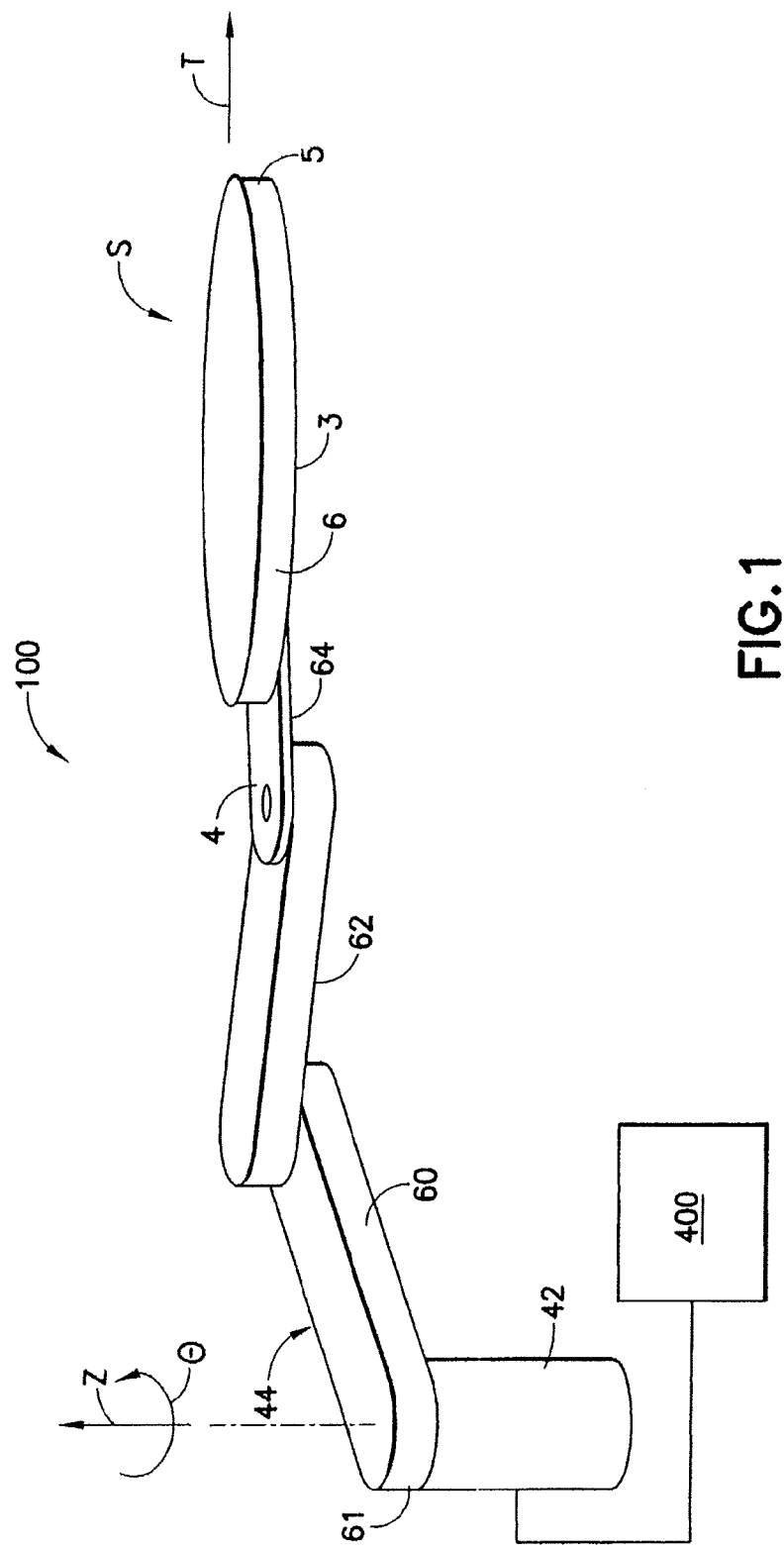
FIG. 1 is a perspective view of a substrate transport apparatus incorporating features in accordance with an exemplary embodiment.

A substrate transport apparatus 100 incorporating the features of the present disclosure and substrate S are illustrated in FIG. 1. Although the present disclosure will be described with reference to the exemplary embodiments shown in the drawings, it should be understood that the present disclosure can be embodied in many alternate forms of the embodiments. In addition, any suitable size, shape or type of elements or materials could be used.

Referring to FIG. 1, the transport apparatus 100 is capable of moving a flat work piece or substrate S as desired, such as for example at least along three axes (as indicated by arrows Z, θ, T, in FIG. 1). The flat work piece is an exemplary work piece and is shown as having a rounded outer circumference for example purposes only. The work piece S may be any flat work piece such as 200 mm, 300 mm, 400 mm or any desired size semiconductor wafer used in the manufacture of semiconductor devices, a semiconductor lithography panel such as a mask or reticle, or flat panel displays. In the embodiment shown in FIG. 1, the transport apparatus 100 has a movable arm 44 that has a general SCARA (selective compliant articulated robot arm) configuration. In alternate embodiments, the transport apparatus may have other suitable configuration, with an articulated arm of any suitable type (e.g. frogleg), or with no articulated arm.

Generally as depicted in FIG. 1, the movable arm 44 in this embodiment is a scara type arm including upper arm 60, forearm 62, and end effector 64. In alternate embodiments, any suitable type of transport arm may be used. The upper arm 60 and forearm 62 are pivotally linked in series. The upper arm 60 is connected to the drive section 42. In this embodiment, the drive section 42 of the transport apparatus 100 may be fixedly mounted to a frame (not shown) of a work piece workstation (not shown). In alternate embodiments, the drive section 42 may be mounted on a car capable of movement in the horizontal plane relative to the frame of the apparatus. The drive section 42 may be a three-axis drive section capable of moving the movable arm 44 along three axes Z, θ, T. The drive section 42 may include suitable drive (not shown) for vertically raising and lowering (i.e. movement along the "Z"axis) the movable arm 44. In addition, the drive 42 may include a co-axial drive assembly (not shown) for moving the movable arm 44 about the rotation axis θ (i.e. θ movement) and for rotating the upper arm 60, forearm 62 and end effector 64 to effect extending or retracting the arm along the radial axis T (i.e. T movement).

A suitable example of a co-axial drive assembly is disclosed in U.S. Pat. No. 5,899,658, which is incorporated by reference herein in its entirety. In alternate embodiments, the coaxial drive may be any other suitable drive capable of moving the movable arm to generate both θ movement and T movement. Controller 400 is connected to the drive section 42 to control arm movements and the corresponding position of the end effector 64.

As shown in FIG. 1, the end effector 64 is constructed, in this embodiment, for attachment to the end of the forearm 62 and is adapted for supporting the work piece S in a secure manner. End effector 64 is constructed having a frame 3 with an attachment 4 and a distal end 5. The work piece is supported from below on support pads (not shown) positioned to contact the work piece S along the circumferential edge 6.

Figure 2A:
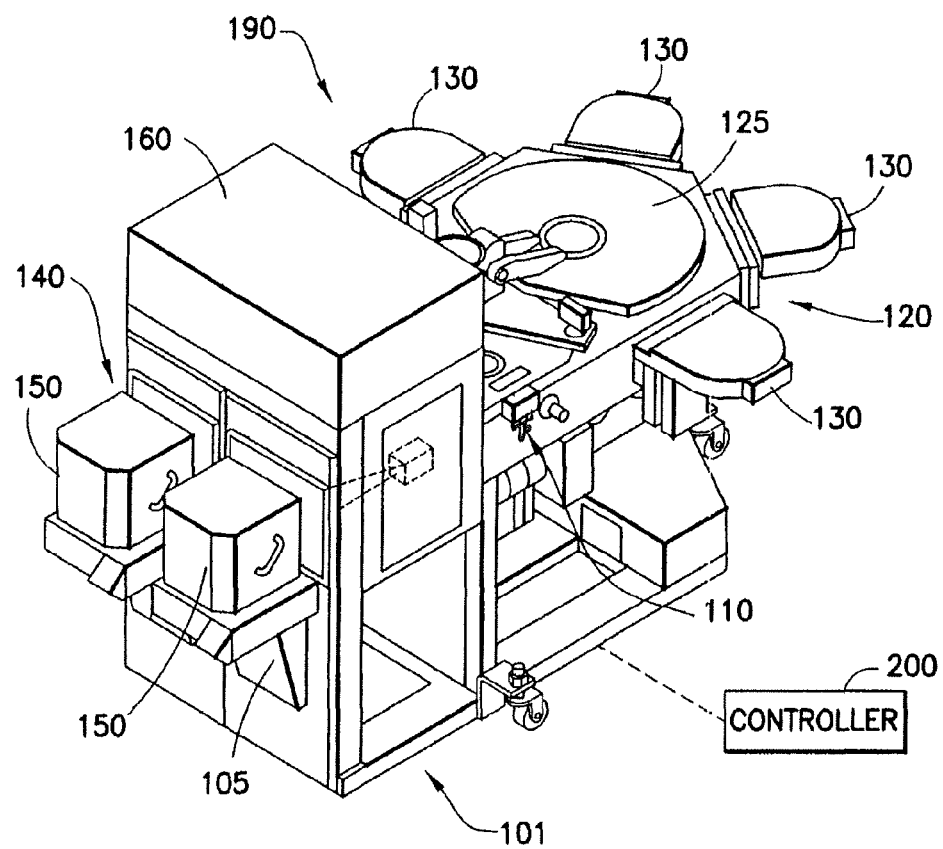
FIGS. 2A and 2B illustrate a semiconductor tool station incorporating features of the substrate transport apparatus of the present disclosure.
Figure 2B:
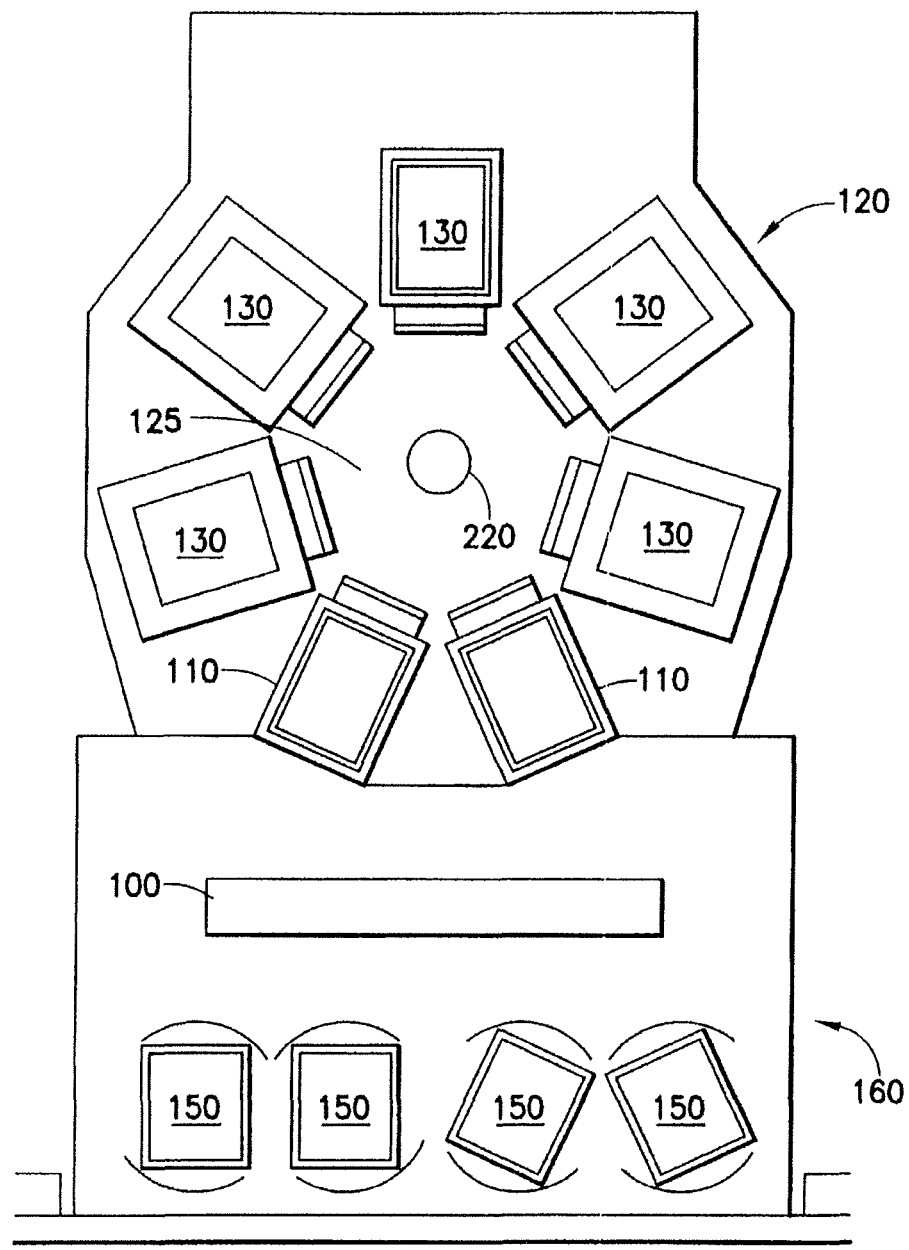

Referring to FIGS. 2A and 2B, the substrate transport apparatus of FIG. 1 may be incorporated into a semiconductor processing tool station 190 in accordance with an exemplary embodiment. Although a semiconductor processing tool is shown in FIG. 2A and 2B, the substrate transport apparatus disclosed herein may be applied to any tool station or application employing robotic manipulators. In this exemplary embodiment, the tool 190 is shown as a cluster tool, however the exemplary embodiment may be applied to any suitable tool station such as, for example, a linear tool station. The tool station 190 generally includes an atmospheric front end 101, a vacuum load lock 110 and a vacuum back end 120. In alternate embodiments, the tool station may have any suitable configuration. The components of each of the front end 101, load lock 110 and back end 120 may be connected to a controller which may be part of any suitable control architecture such as, for example, a clustered architecture control. The control system may be a closed loop controller having a master controller, cluster controllers and autonomous remote controllers. In alternate embodiments, any suitable controller may be utilized.

In the exemplary embodiments, the front end 101 generally includes load port modules 105 and a mini-environment 160 such as for example an equipment front end module (EFEM). The load port modules 105 may be box opener/loader to tool standard (BOLTS) interfaces that conform to SEMI standards E15.1, E47.1, E62, E19.5 or E1.9 for 300 mm load ports, front opening or bottom opening boxes/pods and cassettes 150. In alternate embodiments, the load port modules may be configured as 200 mm wafer interfaces or any other suitable substrate interfaces such as for example larger or smaller wafers or flat panels for flat panel displays. Although two load port modules are shown in FIG. 2A, in alternate embodiments, any suitable number of load port modules may be incorporated into the front end 101. The load port modules may be configured to receive substrate carriers or cassettes 150 from an overhead transport system, automated guided vehicles, person guided vehicles, rail guided vehicles or from any other suitable transport method. The load port modules 105 may interface with the mini-environment 160 through load ports 140. The load ports 140 may allow the passage of substrates between the substrate cassettes 150 and the mini-environment 160. The mini-environment 160 generally includes a substrate transport apparatus 100 as was described in FIG. 1. The mini-environment 160 may be provided a controlled, clean zone for substrate transfer between multiple load port modules.

The vacuum load lock 110 may be located between and connected to the mini-environment 160 and the back end 120. The load lock 110 generally includes atmospheric and vacuum slot valves. The slot valves may provide the environmental isolation employed to evacuate the load lock after loading a substrate from the atmospheric front end and to maintain the vacuum in the transport chamber when venting the lock with an inert gas such as nitrogen. The load lock 110 may also include an aligner 310 for aligning a fiducial of the substrate to a desired position for processing. In alternate embodiments, the vacuum load lock may be located in any suitable location of the processing apparatus and have any suitable configuration.

The vacuum back end 120 generally includes a transport chamber 125, one or more processing station(s) 130 and a substrate transport apparatus 100 as was described in FIG. 1. The backend substrate transport apparatus 220 may be located within the transport chamber 125 to transport substrates between the load lock 110 and the various processing stations 130. The processing stations may operate on the substrates through various deposition, etching, or other types of processes to form electrical circuitry or other desired structure on the substrates. Non-limiting exemplary processes include etching, chemical vapor deposition (CVD), physical vapor deposition (PVD), ion implantation, metrology, rapid thermal processing (RTP), and dry stripping. The processing stations are connected to the transport chamber 125 to allow substrates to be passed from the transport chamber 125 to the processing stations 130 and vice versa.

Figure 3A:
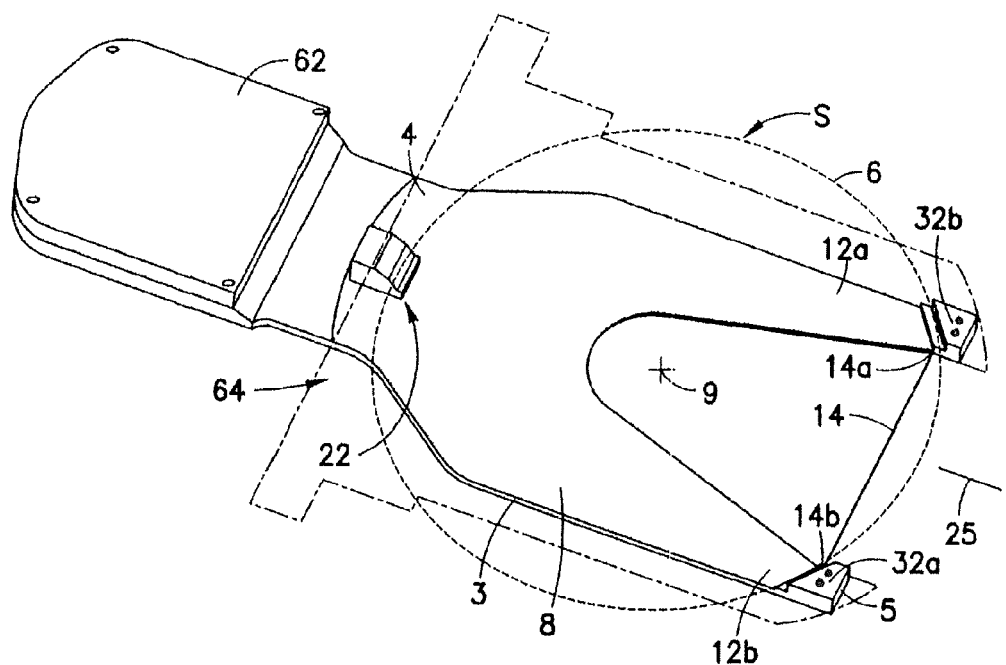
FIG. 3A is a top perspective view of an embodiment of the present disclosure incorporating an inertial wafer centering end effector with a fork-shaped design.
Figure 3B:
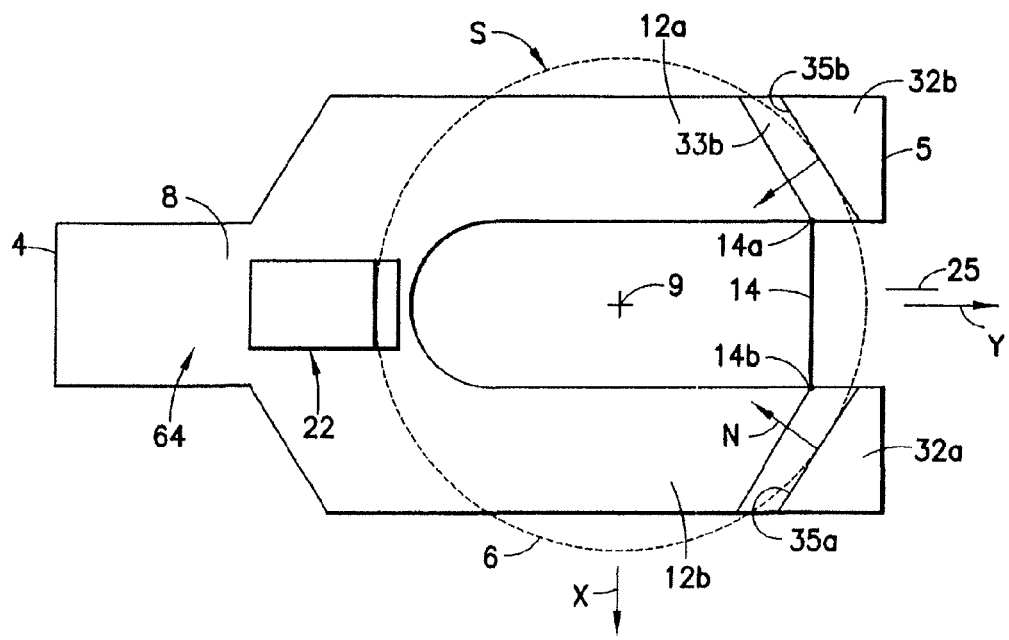
FIG. 3B is a top view of an embodiment of the present disclosure incorporating an inertial wafer centering end effector with a fork-shaped design.

Referring to FIGS. 3A and 3B, one exemplary embodiment of the end effector 64 disclosed herein may have a fork-shaped end effector blade 8. The end effector may be connected to the forearm 62 of the substrate transport apparatus via an attachment 4. The end effector 64 is constructed having a frame 3 with an attachment 4 and a distal end 5. The end effector 64 may have three perimeter pads 22, 32a, 32b attached to the fork-shaped blade 8 for centering and capturing a flat work piece. One exemplary flat work piece is a silicon wafer S, also referred to herein as a semiconductor wafer or a substrate. The silicon wafer S is supported on the end effector blade by the pads (also referred to herein as support pads) 22, 32a, 32b, which are positioned on the end effector blade 8 to contact the circumferential edge 6 of the wafer S. In the exemplary embodiment shown there are two front support pads 32a, 32b attached to the end effector blade tips 12a, 12b at the distal end 5 of the end effector 64, and one back support pad 22 attached to the end effector blade 8 near the rear attachment 4. In alternate embodiments, the edge grip pads may be arranged in any desired configuration. The design of the pads 22, 32a, 32b will be described in greater detail below. Between the front pads 32a, 32b and the rear pad 22 is a center point 9, which represents in the exemplary embodiment a centering position with respect to which the substrate S may be centered by the inertial capture centering grip as will be described below.

Still referring to FIGS. 3A and 3B, the exemplary embodiment of the end effector 64 also includes a mapping and wafer presence sensor 14. In the exemplary embodiment, sensor 14 is a thru beam sensor 14 that includes a suitable source 14a and a suitable source detector 14b incorporated into the end effector blade tips 12a, 12b. The thru beam sensor 14 may be used to map silicon wafers S in a carrier or cassette (e.g. carriers 150 see FIGS. 2A, 2B) prior to handling by the substrate transport apparatus, to detect the presence of a silicon wafer S on the end effector blade 8, and to determine if the silicon wafer S is in the proper position on the front and rear pads 22, 32a, 32b of the end effector 64. The multifunctional capacity of the thru beam sensor 14 of the present disclosure eliminates the need for a separate wafer present sensor, and hence simplifies the design of the end effector. Correspondingly, the simplified design reduces manufacturing and maintenance costs associated with the inertial wafer centering end effectors disclosed herein. In alternate embodiments, the mapping and presence sensor may be any suitable type of sensor.

Figure 4:
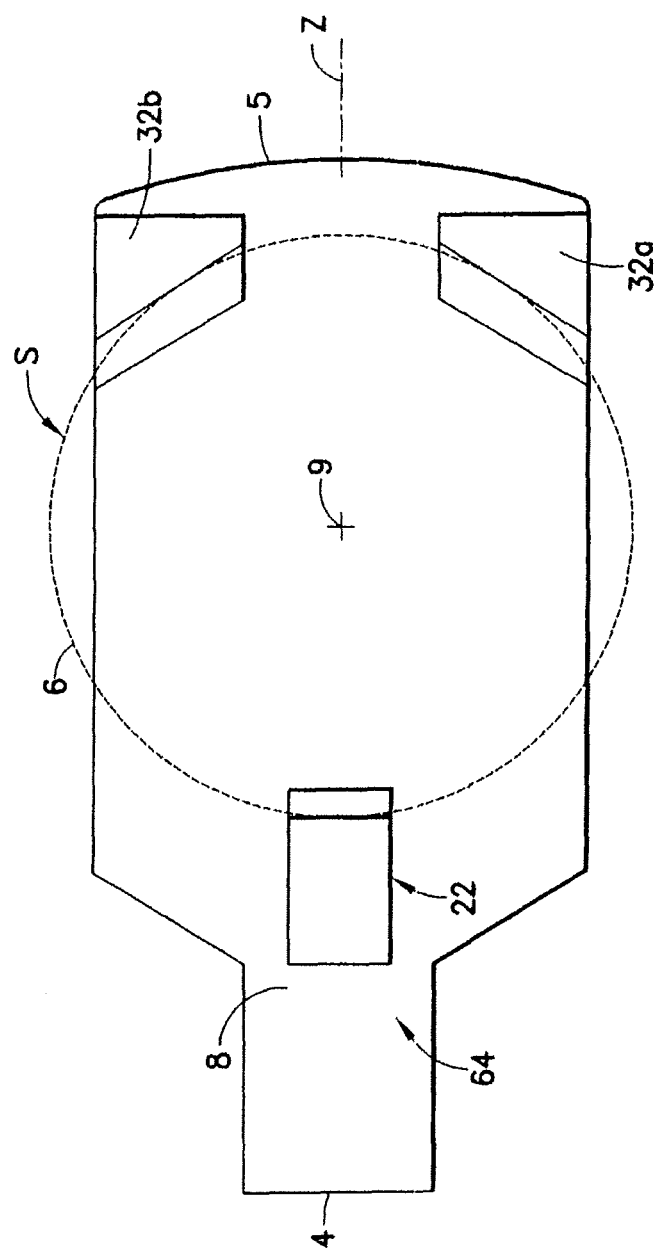
FIG. 4 is a top view of an embodiment of the present disclosure incorporating an inertial wafer centering end effector with a paddle shaped design.

The inertial wafer centering end effectors disclosed herein may be used with end effector blades having a variety of shapes. Referring to FIG. 4, in another exemplary embodiment of the end effector may have a paddle-shaped end effector blade 8 is shown. With a paddle-shaped end effector 64, the front support pads are attached near the front end of the end effector blade 8 in order to contact the circumferential edge 6 of the wafer S. The wafer presence sensor (not shown) may be repositioned and incorporated in the front of the end effector blade 8 for detecting the presence of a wafer S on the end effector 64. A separate mapping sensor (not shown) may be used with the paddle-shaped end effector design [r1].

Figure 5A:
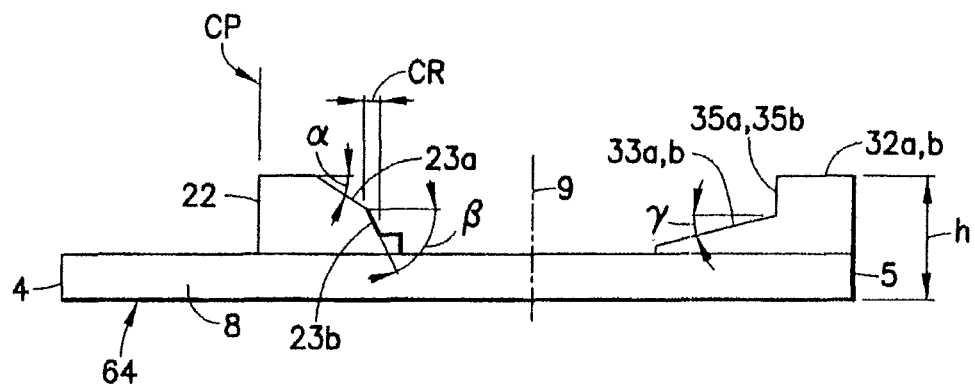
FIG. 5A is a side view of an embodiment of the inertial wafer centering end effector.
Figure 5B:
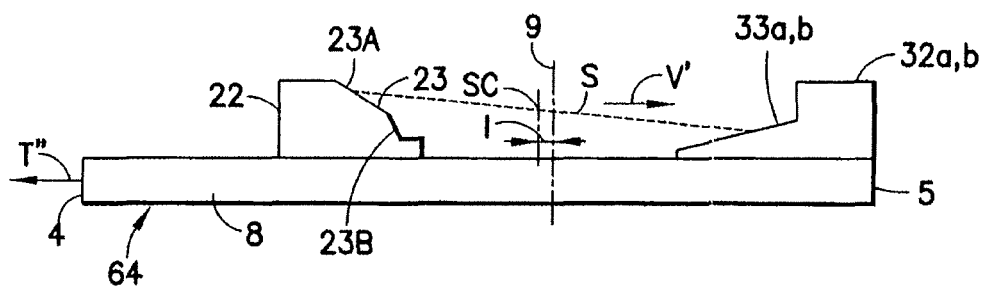
FIG. 5B is a side view of an embodiment of the inertial wafer centering end effector with a flat work piece present in an eccentric and skewed position after pick.
Figure 5C:
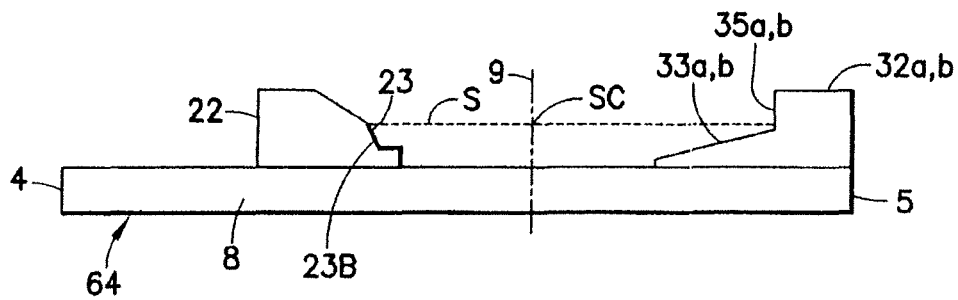
FIG. 5C is a side view of an embodiment of the inertial wafer centering end effector with a flat work piece present in a centered and horizontal position after centering.

Referring to FIGS. 5A, 5B and 5C, one exemplary embodiment of the support pad design of the inertial wafer centering end effector disclosed herein will be described. The end effector 64 includes an end effector blade 8 with asymmetric front 32a, 32b and rear 22 support pads. Asymmetric front pads relative to the rear pad means that the two front pads are of a different design than the rear pad. As previously described, the rear pad 22 is positioned towards the attachment end 4 of the end effector 64 and the front pads 32a, 32b are positioned towards the distal end 5 of the end effector 64. The terms front and rear are used for convenience to describe the positional reference of the end effector with respect to the travel of the end effector (such as along the axes, T, θ, Z) with the front reaching a given position then the rear when the end effector is advancing (e.g. in the direction indicated by arrow T) and the rear reaching a given position and then the front when returning (e.g. opposite to arrow T). A centerline 9 between the two front pads 32a, 32b and the one rear pad 22 is also indicated. The support surfaces 23, 33 are defined herein as the surfaces where the circumferential edge 6 of the flat work piece contact the rear and front pads 22, 32a, 32b respectively. In alternate embodiments, the pads may be positioned in any other desired orientation to effect inertial centering and capture.

FIG. 5A illustrates the front and rear pads without the presence of a flat work piece. In the exemplary embodiment, the two front pads 32 a, 32 b may be similar to each other, having a generally wedge shape with an angle of incidence of γ for the support surfaces 33a, 33b of the pads. The angle of incidence γ for the front pads 32a, 32b may range from about 5 to about 70, or about 20 to about 60, or about 30 to about 50 degrees, though in the exemplary embodiment shown the angle γ is about 8°. The angled support surfaces 33a, 33b for the two front pads 32a, 32b provide a contact and sliding or ramp surface used to contact and support the wafer during initial positioning and then operate to effect capture of the flat work piece or wafer on the end effector 64. The pads may be made from a suitable material, such as PVC or DELRIN™, having suitable lubricious properties to allow substantially free sliding of the peripheral edge of the workpiece over the ramp surface(s) 33a, 33b when inertial centering and capture is being effected as described below. By way of example, when the wafer is picked up by the end effector and substrate transport system 100 (see FIG. 1) from a carrier, cassette or a processing position (e.g. cassette 150, load locks, processing modules 130). The peripheral edge of the wafer, with the wafer in the initial pick position, may rest on the ramp surface. The wedge shaped ramp surfaces 33a, 33b of the front pads 32 a, 32 b permit the leading edge of the flat work piece to slide and be secured or captured between the pads upon end effector 64 movement. The ramp surfaces may also cause centering of the wafer. Each of pads 32 a, 32 b may also have a respective buffer surface 35a, 35b that operates to stop wafer sliding on the ramp and grip the periphery of the wafer to capture the wafer on the end effector. The buffer surface 35a, 35b may be oriented substantially vertically or may be inclined or pitched inwards (towards centerline 9) in order to trap a portion of the wafer peripheral edge between ramp and buffer surface. In the exemplary embodiment, the height of pads 32 a, 32 b may be sized, so that the profile height of the end effector at the location of pads 32 a, 32 b is less than the SEMI specified spacing between tracked substrates with sufficient clearances to allow free insertion of the end effector between stacked substrates.

Again referring to FIG. 5A, in the exemplary embodiment the rear pad 22 may also be wedge shaped, but includes two angled support surfaces 23a, 23b with angle of incidences of α and β respectively (from horizontal reference). Generally, the angle of incidence of β is greater than α. The inclined surface 23b with steeper angle of incidence β is located closer to the centerline 9 and may range from about 30 to about 80 degrees though in the exemplary embodiment shown, the angle B is about 74°. The shallower surface 23a with angle of incidence α is located closer to the attachment end 4 and may range from about 10 to about 70 degrees though in the exemplary embodiment shown the angle α is about 45°. The angled support surfaces 23a, 23b for the rear pad 22 provide for contact and sliding or ramp surfaces used to initially position, capture, and center the flat work piece on the end effector 64. More particularly, the rear pad 22 is used to capture and center the trailing edge of the flat work piece when it is picked up by the end effector 64 and substrate transport system 100 from a carrier, cassette, FOUP or a processing position or station (not shown). Generally, the ramp surface 23A closer to the attachment end 4 of the rear pad 22, may be sized to accommodate the SEMI specified wafer position range (for a wafer at a wafer station or cassette) as well as any desired eccentricity during the pick (as will be described below) to ensure that for initial positioning, the substrate edge when the substrate is picked up by the end effector 64 will initially rest on ramp 23A. Thus, ramp surface 23A may define the capture range CR of the inertial capture grip. In the exemplary embodiment shown, the ramp surface 23A may be located above ramp surface(s) 33A, 33B of pads 32A, 32B, and as may be realized a substrate with the peripheral edges contacting ramp surfaces 23A, 33a 33b will be pitched with the portion on ramp surface 23A higher than the portion on ramp surface(s) 33a, 33b. Moreover, it may be realized in view of the different angle of inclination α, ϒ respectively of the rear 23A, and front 33a, 33b ramp surfaces (e.g. the rear ramp being more steeply inclined than front ramp) that the rear ramp in the example may be capable of generating an uncompensated force component against the substrate that urges the substrate forwards. The support surface 23B, closer to the center line 9, may be used to define the centering range for final positioning of the substrate edge after end effector 64 movement (to be described in greater detail below). As may be realized, the front and rear pads 32a, 32b, 22 may be positioned with respect to each other so that the captured substrate, having its periphery against buffers 34a, 35b, contacts capture surface 23B of the pad 22 at a location resulting in the substrate being held in a substantially horizontal position held by edge contact only. Moreover, the pads are positioned so that the captured substrate is centered, for example with respect to centering position 9.

FIG. 5B illustrates the front and rear pads with a flat work piece S for example at the initial pick from a cassette, carrier, FOUP or a processing position or station (see FIGS. 2A-2B). The flat work piece S for example may be initially picked up in an eccentric position (substrate center SC may be offset from centering position 9) between the front and rear pads 32a, 32b, 22. In the exemplary embodiment the substrate eccentricity for the initial pick may be about 1.0 mm, and sufficient to overcome any positional variance of the substrate at the substrate station. In alternate embodiments, any desired eccentricity may be used. The eccentricity e, which is in direction towards pad 22, results in the peripheral edge of the substrate contacting ramp surface 23A during the initial pick. As noted before, in this position the substrate periphery also rests on ramps 33a, 33b and the substrate may be skewed as shown. The thru beam sensor (see FIG. 3A) and controller 200 (see FIG. 2A) may be used to guide the end effector 64 to pick-up the substrate S in the skewed and eccentric position shown in the example.

FIG. 5C illustrates the front 32a, 32b and rear pads 22 with a flat work piece or substrate S after inertial repositioning of the substrate, such as by movement by the end effector 64, is used to reposition the substrate S between the support pads 22, 32a, 32b. As may be realized, in the eccentric position established by the substrate pick with the end effector, the substrate S may be at static equilibrium but statically due to the geometry of the ramp surfaces 23A, 33a, 33b in the exemplary embodiment on which the substrate S rests. Accordingly, in the exemplary embodiment, the geometry of the ramp surfaces operates in combination with an inertial disturbance of desired magnitude to overcome the static forces, to guide the substrate to the captured as well as centered position. By way of example, when the end effector 64 is moved by the substrate transport apparatus (see FIG. 1) such as in the horizontal plane, an inertial force created by for example acceleration of the end effector 64 effectuates a repositioning of the substrate from the skewed position (FIG. 5B) to a horizontal position (FIG. 5C), and a centering of the substrate S with respect to the centering reference 9. The end effector may be accelerated in the directions indicated by arrow T, θ in FIG. 1. In the example shown in FIG. 5B, the end effector may be accelerated in the direction indicated by arrow T'', which may be aligned with a radial direction of the transport arm. For example, the end effector may be accelerated from a substrate pick at a substrate station. As may be realized, the inertial effects on substrate S from the end effector acceleration T'' overcome the static forces (holding the substrate in its skewed position), that result in relative displacement between substrate and pads 22, 32a, 32b in the direction indicated by arrow V' (FIG. 5B) substantially opposite to the motion of the end effector. In the exemplary embodiment, the inertial motion carries the substrate S towards the centered position. In addition, ramp 23A generates a biasing force on the substrate S further contributing to the forces (that may include both inertial and direct components) driving the substrate to buffers 34a, b. Hence, the lateral inertial force provided by motion of the end effector 64 causes the substrate S to slide down the rear pad surface 23A with angle of incidence α, and on to ramp surface 23B having greater angle of incidence β of the rear pad 22. In the exemplary embodiment, the steeper inclination of the ramp surface 23B, further increase the bias force urging the substrate towards buffers 35a, 35b and increases the wedging forces on the substrate resulting in capture of the substrate. The length of the support surface 23 for the β angle of incidence defines the centering range CR for final capture of the substrate S after movement of the end effector 64 (see FIG. 5A).

Referring again to FIGS. 3A-3B, in the exemplary embodiment the ramp surfaces 33a, 33b and buffers 35a, 35b on the front pads 32, 32b may be arranged to provide centering forces in the X direction (centering forces in the Y direction being provided by inertial effects and ramp surfaces 23A, 23B of pad 22, along with buffers 35a, 35b as described above). As seen best in FIG. 3B, ramp surfaces 33a, 33b, and buffers 35a, 35b, represented by arrow N, normal to the ramp surfaces and buffers, may be positioned angled to the X, Y axes. In the exemplary embodiment the orientations of the ramp surfaces and buffers may be symmetric relative to the Y axis. The angled orientation of the ramp surfaces and buffers, result in opposing force components along the X axis that tend to center the substrate along the X axis with respect to centering datum 9. As may be realized, eccentricity between substrate and centering datum 9 along the X axis, will result in centering force bias generated by ramp surfaces 33a, 33b and or buffers 35a, 35b against the substrate sliding over the ramp surfaces or buffers, under impetus from inertial effects and/or bias from ramps 23A, 23B as it moved to capture driving the substrate to a centered position along the X axis with respect to reference datum 9. Correspondingly, with respect to the two front pads 32a, 32b, the edge of the substrate S slides along on the angle of incidence γ of the support surfaces 33a, 33b such as to center the substrate between the front and rear pads 32a, 32b, 22, and reposition it in a horizontal position (along axes X and Y). The thru beam sensor (not shown) and controller (not shown) are used to determine if the substrate is centered and in a horizontal position after movement by the end effector 64.

In an alternative embodiment to that depicted and described in FIG. 5, the front pads may include two, three, four or more angled ramp surfaces, or a rounded ramp surface with the angle of incidences closer to the centerline generally greater than the angle of incidences further from the centerline in order to provide for a ramp type driving force to capture the substrate between the pads. The rear pad may include three, four, five or more angled ramp surfaces, (or rounded ramp surface) with the angle of incidences closer to the centerline generally greater than the angle of incidences further from the centerline in order to provide for a ramp type driving force to both capture and center the substrate between the pads. In other alternate embodiments, one or more pads may be generally of similar design, whereas one or more pads may be of different design to help establish unstable static and dynamic positions for the substrate biasing the substrate to a captured and/or a centered position. Hence the front pads and rear pad may be defined, as previously described, as being asymmetric with respect to one another. In another alternative embodiment to those depicted and described in FIGS. 3, 4 and 5, the number of front pads may be three, four, five or more. The number or rear pads may be two, three, four or more.

Referring now again to FIG. 2, controller 200 may be programmed, such as for example during the teaching of the substrate transport apparatus 100 of the substrate pick locations, to position the end effector when picking the substrate in order to generate desired eccentricity between the substrate S and end effector pads 22, 32a, 32b as previously described. As may be realized, in the exemplary embodiment, the locations taught the controller 200, for respectively picking and placing substrates as a given tool location may be different. Moreover, in the exemplary embodiment, inertial effects in the substrate, to effect capture, may be generated from the same transport motion used to transport the substrate to a desired destination without transport movements specific to substrate capture. For example, upon initial pick, withdrawal of the transport to remove the end effector and substrate from the substrate holding location of the tool may effect capture and centering of the substrate on the end effector.

Figure 6A:
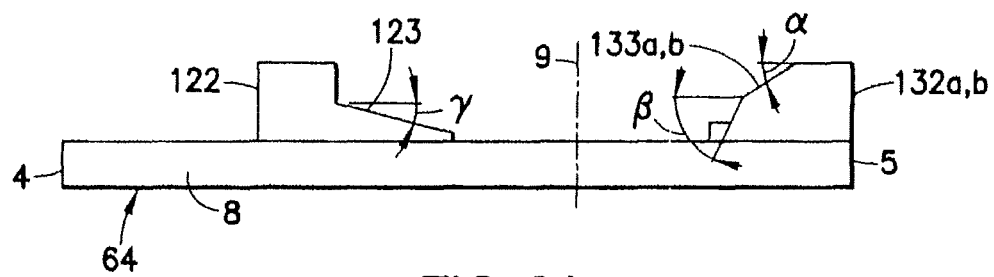
FIG. 6A is a side view of another embodiment of the inertial wafer centering end effector.
Figure 6B:
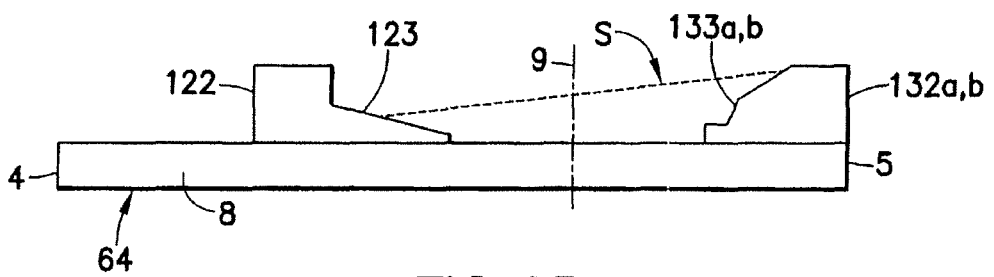
FIG. 6B is a side view of another embodiment of the inertial wafer centering end effector with a flat work piece present in the eccentric and skewed position after pick.

In another exemplary embodiment of the inertial wafer centering end effector disclosed herein (and illustrated in FIGS. 6A-6C), the two front support pads 132a, 132b may each include two angled support surfaces 133a, 133b with angle of incidences of α and β respectively. Correspondingly, the one rear pad 122 is wedge-shaped with a single angle of incidence γ. Pads 132a, 132b may be similar to pad 22 described previously and pad 122 may be similar to pads 32a, 32b. Similar features are similarly numbered. Referring to FIG. 6A (no substrate present), the two front pads may each include two angled support surfaces 133a, 133b with angle of incidences of α and β respectively. Generally, the angle of incidence of β is greater than α. The steeper angle of incidence β is located closer to the centerline 9. The shallower angle of incidence α is located closer to the distal end 5. The angled support surfaces 133a, 133b for the two front pads 132a, 132b provide for contact and sliding surfaces used to initially position, and then capture and center the flat work piece on the end effector 64. Referring again to FIG. 6A, the rear pad 122 may be wedge shaped with a single angle of incidence γ for the ramp surface 123. The angled support surface 123 for the rear pad 122 provides a contact and sliding surface used to initially position and capture the flat work piece on the end effector 64 in a manner similar to that as previously described. FIG. 6B illustrates the front and rear pads with a flat work piece S after initial pick from a cassette, carrier, FOUP or a processing position or station (not shown). The flat work piece S is initially picked up in a skewed and eccentric position between the front and rear pads 132a, 132b, 122.

Figure 6C:
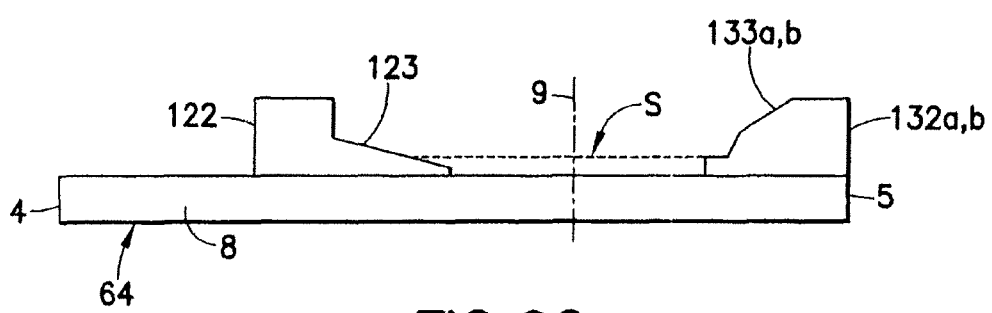
FIG. 6C is a side view of another embodiment of the inertial wafer centering end effector with a flat work piece present in the centered and horizontal position.

FIG. 6C illustrates the front and rear pads with a flat work piece S after movement by the end effector 64 is used to reposition the substrate S between the support pads 122, 132a, 132b in a manner similar to that previously described. In the exemplary embodiment, the lateral force provided by acceleration of the end effector 64 causes the substrate S to slide down the two front pad surfaces 133a, 133b from angle of incidence α to angle of incidence β of the front pads 132a, 132b. The length of the support surfaces 133a, 133b for the β angle of incidence defines the centering range for final capture of the substrate S after movement of the end effector 64. Correspondingly, with respect to the rear pad 122, the edge of the substrate S slides along on the angle of incidence γ of the support surface 23 such as to center the substrate between the front and rear pads 32a, 32b, 22, and reposition it in a horizontal position. The thru beam sensor (not shown) and controller (not shown) are used to determine if the substrate is centered and in a horizontal position after movement by the end effector 64.

Figure 7A:
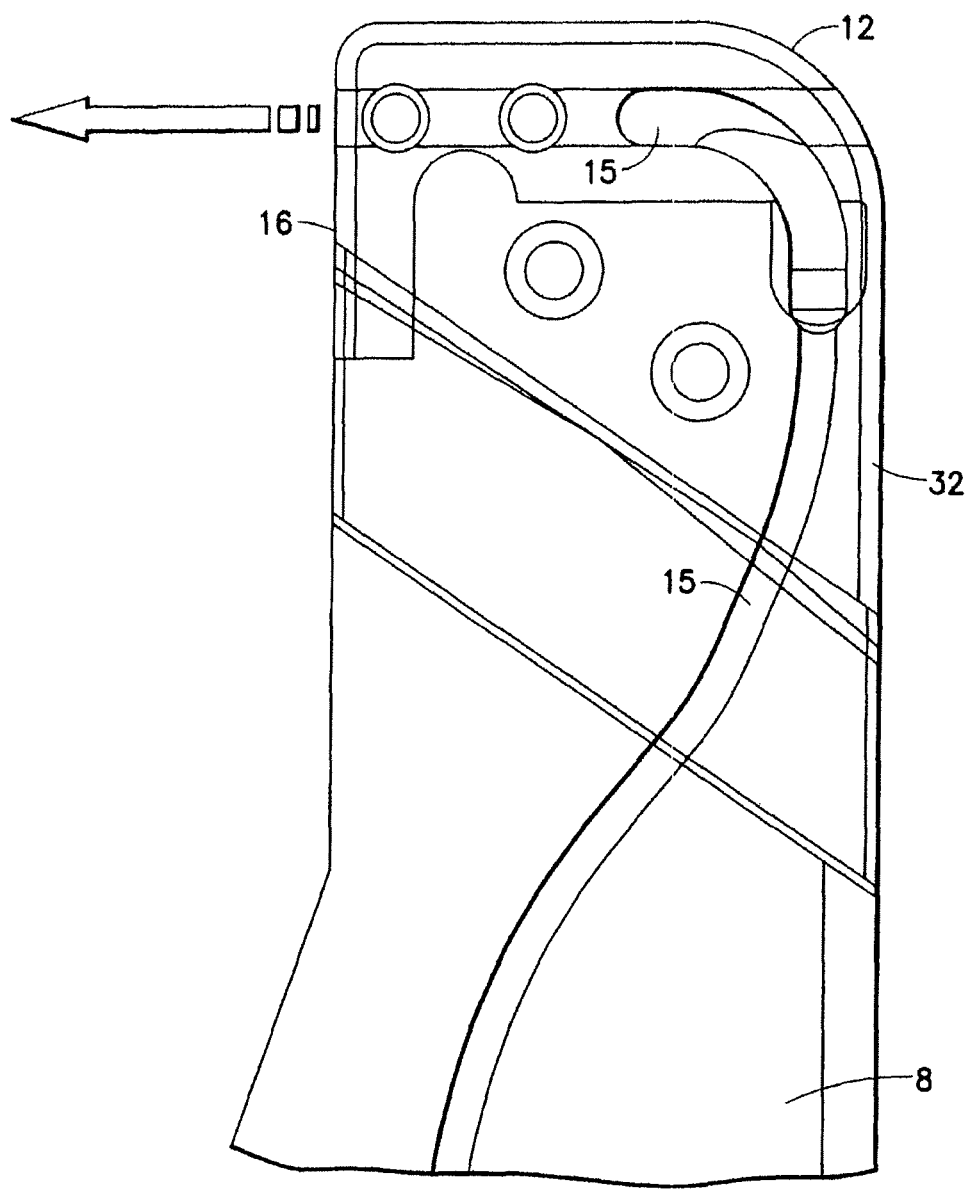
FIG. 7A is a top design view of an end effector blade tip depicting the fiber routing channel for the thru beam sensor.

FIG. 7A illustrates a lower surface of a representative pad 32 showing an example of a fiber routing channel for a fork-shaped end effector blade tip 12. The fiber routing channel 15 is positioned within the end effector blade 8 and travels out to the end effector blade tip 12 where the thru beam sensor 14 may be located adjacent to the inside surface 16 of the blade tip 12. Referring again to FIG. 3A, the front support pads 32a, 32b may be attached to the end effector blade tip 12. This positioning of the thru beam sensor 14 permits it to be used for mapping substrates within carriers, cassettes and processing stations, and also for detecting the presence and proper positioning of substrates (see FIGS. 5C, 6C) on the support pads.

FIG. 7B is a side design view of a portion of the fork-shaped end effector disclosed herein with a flat work piece S supported by a front support pad 32 (similar to pads 32a, 32b described previously). The front support pad 32 is attached to the fork-shaped end effector blade 8 at the blade tip 12. FIG. 7B illustrates the location of the thru beam generated by (suitable source of) sensor 14 position so as to detect the presence of the flat work piece S on the wedge-shaped front support pad 32. When the thru beam sensor source 14 is fully interrupted by the flat work piece S is indicative that the flat work piece S is correctly positioned on the end effector. The sensor may be connected to the controller to send a signal upon detection that the substrate S is located in the desired position and hence captured and centered. The controller may also be programmed to register lack of a wafer presence signal from the sensor, in response to which the controller may access suitable program to bring the transport to a stop with a motion profile ensuring the wafer is not lost. The controller may for example initiate a fault signal, and after stop may retry a substrate capture motion (in the event the substrate did not fully seat before) or may initiate some other desired recovery program.

Figure 8:
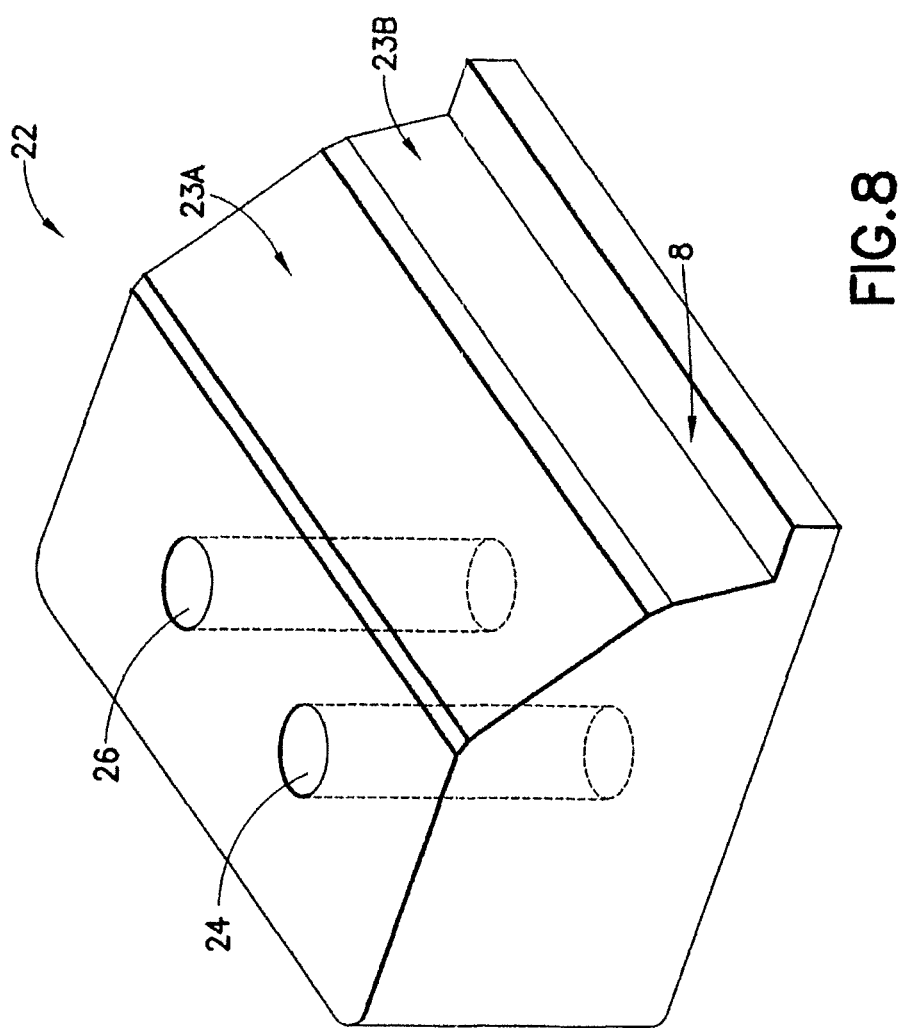
FIG. 8 is a top perspective view of an end effector support pad and the surfaces for initial flat work piece positioning, centering and capture.

FIG. 8 is a top perspective view of a representative rear support pad 22 in accordance with an exemplary embodiment. In the embodiment shown the pad may have mounting holes 24, 26 (two are shown for example) for securing it to the end effector blade 8 and the two radial or angled support surfaces 23A, 23B for inertial work piece positioning, and work piece centering and capture. In FIG. 8B, bolts, screws or other suitable fastening means (not shown) may be used to attach the support pad 22 to the end effector blade 8.

Figure 9A:
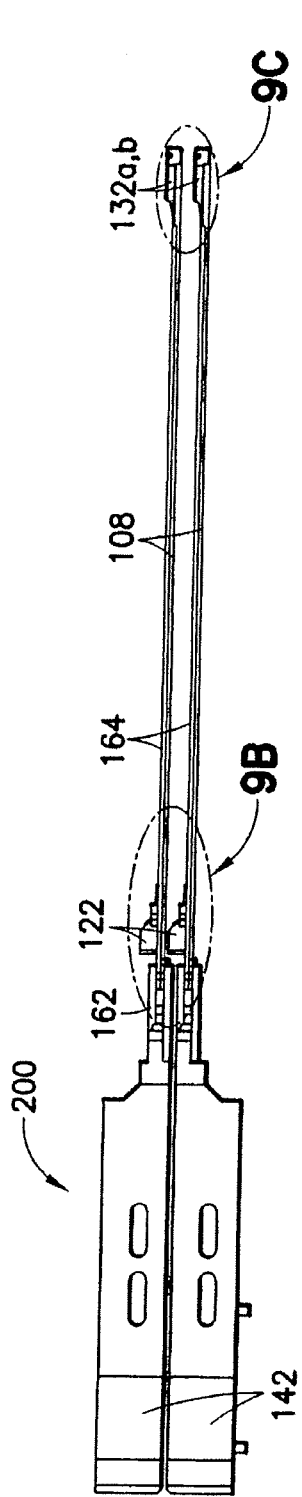
FIG. 9A is a side view of another embodiment of the inertial wafer centering end effector and transport apparatus.
Figure 9B:
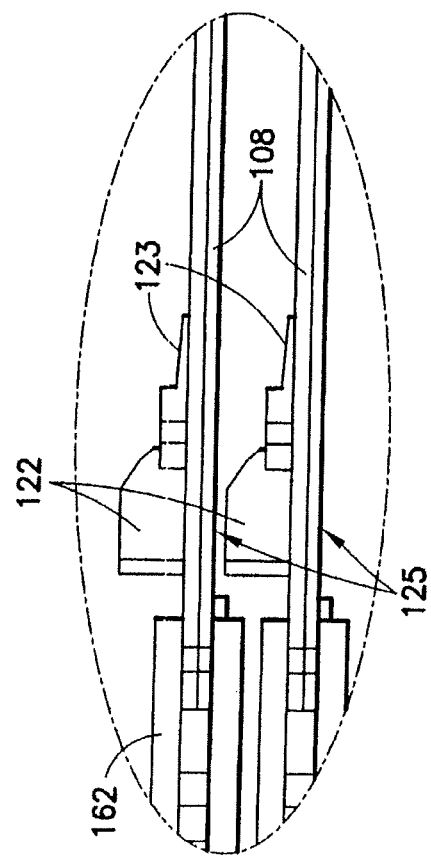
FIG. 9B is an enlarged side view of the rear pad portion of FIG. 9A.
Figure 9C:
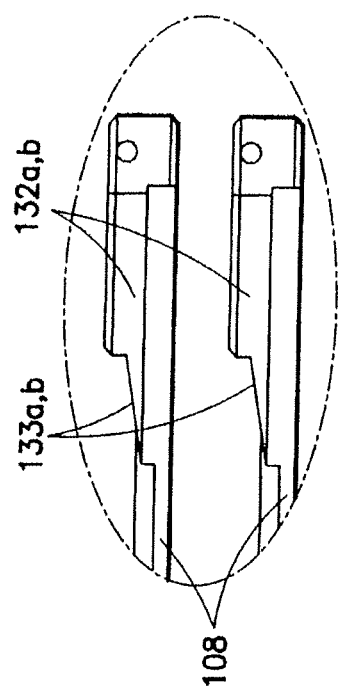
FIG. 9C is an enlarged side view of the front pad portion of FIG. 9A.

In another embodiment of the inertial wafer centering end effector disclosed herein, the substrate transport apparatus may include a plurality of end effectors in substantially position relative to one another. Non-limiting examples include a substrate transport apparatus with two, three, four, five, or more inertial wafer centering end effectors disposed in a parallel position relative to each other. A plurality of end effectors on a given transport apparatus permits for two or more flat work pieces to be simultaneously picked up, positioned, centered, captured and transported. FIG. 9A illustrates an exemplary substrate transport system 200 with two end effectors 164 attached to corresponding forearms 162 connected to a drive section 142. The two parallel end effectors 164 may be similar to each other, and to end effector 64 described before (each have an end effector blade 108 on which the two front pads 132a, 132b and one rear pad 122 may be attached) similar features are similarly numbered. The end effector blades may be of the same or a different shape (fork-shaped, paddle-shaped or other). The height of each parallel end effector 162 including the attached front and rear support pads 132a, 132b, 122 is such it may fit between closely spaced silicon wafers (not shown) stored within a cassette. FIG. 9B is an exemplary side design view of the two parallel rear pads 122. The two parallel rear pads 122 each have two angled or profiled support surfaces 123 for substrate (not shown) initial positioning, centering and capture.

Figure 10A:
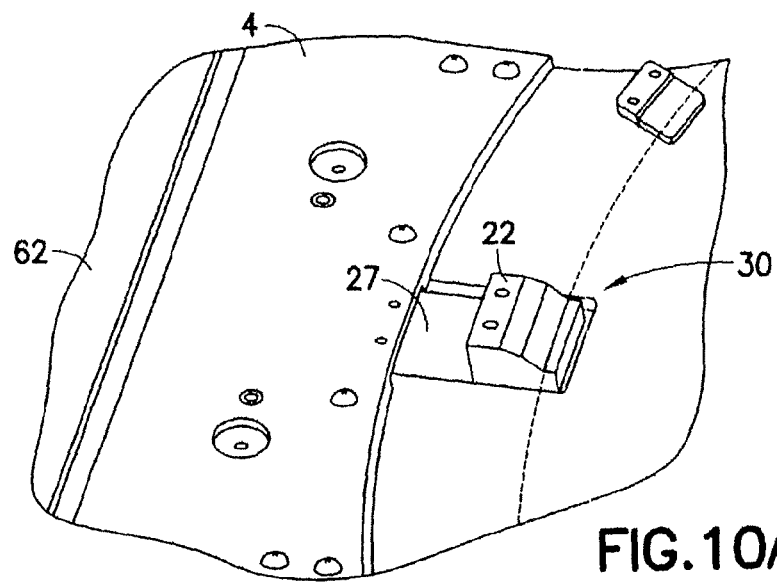
FIG. 10A is a top perspective view of an embodiment of the rear pad assembly of the inertial wafer centering end effector.
Figure 10B:
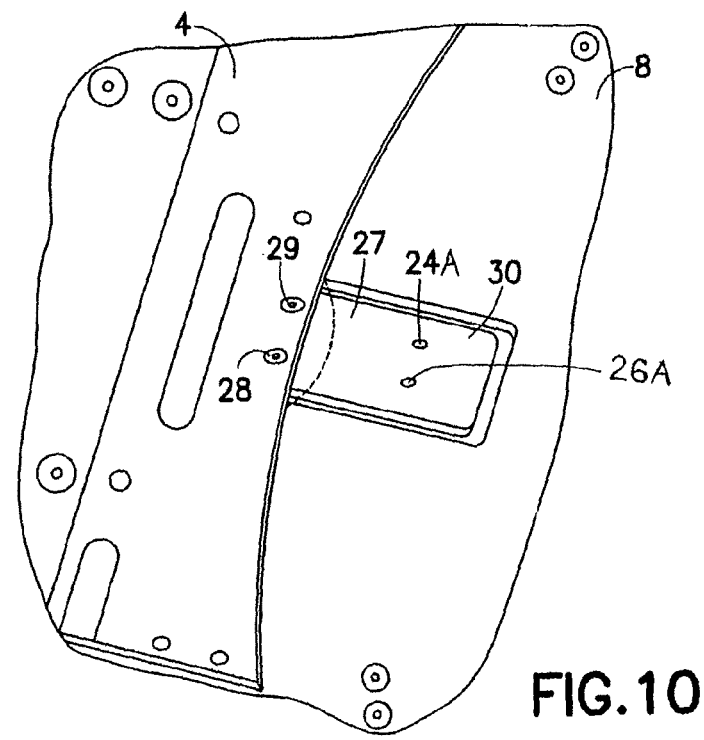
FIG. 10B is a bottom perspective view of an embodiment of the rear pad assembly of the inertial wafer centering end effector.
Figure 10C:
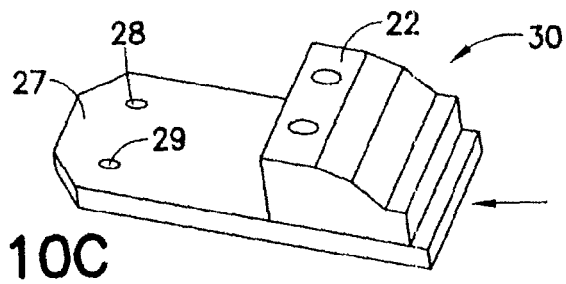
FIG. 10C is a top perspective view of an embodiment of the rear pad and rear pad arm of the inertial wafer centering end effector.

Referring to FIG. 10A, a schematic of an exemplary embodiment of the rear pad assembly 30 of the inertial wafer centering end effector disclosed herein illustrates that it may be slotted for front to rear adjustability. This permits the rear pad 22 position to be easily altered relative to the distal end of the end effector blade 8 to accommodate different size flat work pieces. Also depicted is the attachment 4 which connects the end effector 64 to the forearm 62. FIG. 10B is a bottom view of the rear pad assembly 30 and illustrates that in the exemplary embodiment the rear pad (see FIG. 10A) may be mounted to a rear pad arm 27 via suitable fasteners such as bolts or screws 24A, 26A. The rear pad arm 27 may also be attached to the attachment 4 via bolts or screws 28, 29. The rear pad assembly 30 including the rear pad arm 27 and the rear pad 22 is also illustrated in FIG. 10C. The rear pad assembly 30 may be easily removed from the end effector 64 when desired such as for repair or replacement of the rear pad 22.

Figure 11:
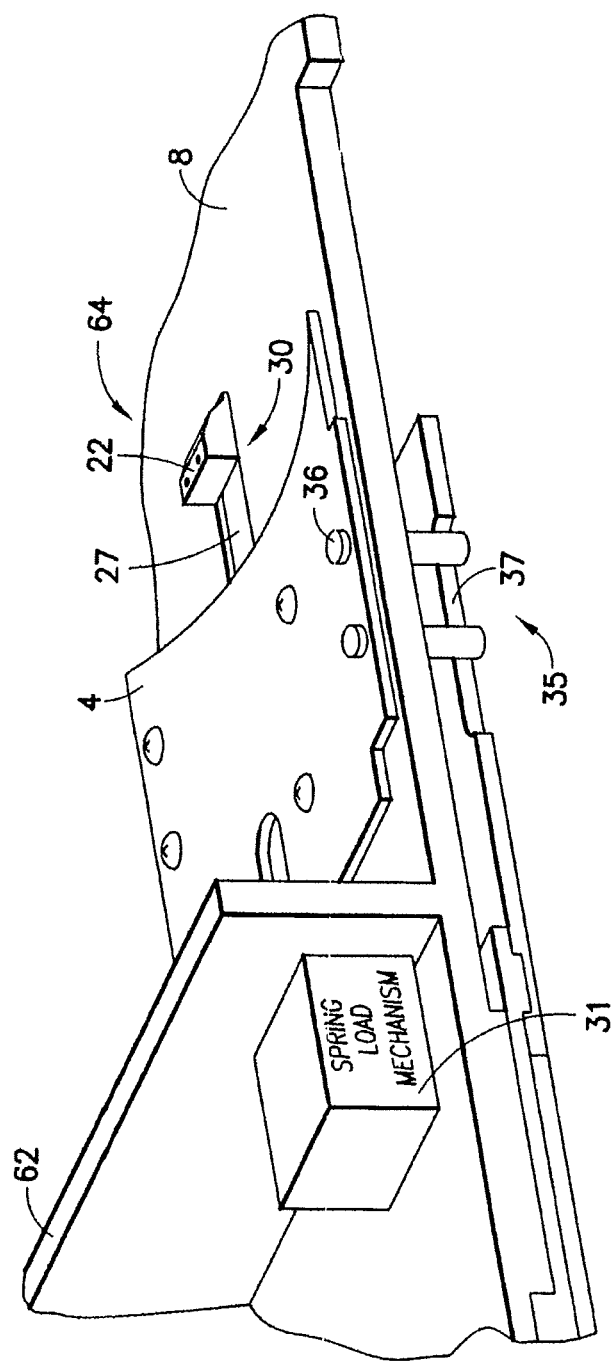
FIG. 11 is another partial top perspective view of the rear pad assembly of the inertial wafer centering end effector.

Referring to FIG. 11, the rear pad assembly 30 in accordance with another exemplary embodiment may be mounted as a spring loaded type mechanism 31 to allow for further flexibility in front to rear adjustability of the rear pad 22 relative to the end effector blade 8. The rear pad assembly 30 including the rear pad and the rear pad arm 27 may also be fabricated to move along the attachment 4 between the forearm 62 and end effector 64 via a pin and slot type mechanism 35 to further facilitate front to rear adjustability of the rear support pad 22. One or more pins 36 are located in the attachment plate 4 and one or more slots 37 are located in the rear pad arm 27. This pin and slot type mechanism (also referred to as a sliding tongue type mechanism) 35 allows for the rear support pad to be quickly adjusted from front to rear of the end effector blade to accommodate for changes in flat work piece diameter and rear pad 22 dimensions due to surface wear.

In an alternative embodiment of the initial wafer centering end effector disclosed herein, an advantageous method for transporting a flat work piece is provided. The method includes initially providing a flat work piece transport apparatus including a drive shaft, a movable arm connected to the drive shaft, an end effector connected to the moveable arm, wherein the end effector includes asymmetric front and rear pads mounted to the end effector blade and a thru beam sensor mounted within the end effector blade, and a controller for coordinating the drive section, the moveable arm, the end effector and the thru beam sensor. The thru beam sensor is used to map the position of the flat work piece relative to the position of the front and rear pads of the end effector blade. This permits the end effector blade to pick up a flat work piece in a skewed and eccentric position on the support surfaces of the front and rear pads of the end effector blade as is depicted in FIGS. 5B and 6B. The thru beam sensor may then be used to detect an eccentricity of the flat work piece on the support surfaces of the front and rear pad.

The end effector may be moved to provide a lateral force to the flat work piece to simultaneously center and capture the flat work piece in between the front and rear pads in a horizontal position as is depicted in FIGS. 5C and 6C. The centered and captured flat work piece may then be transported to one or more processing stations, and in particular stations for silicon wafer processing. Non-limiting exemplary processing stations include etching, chemical vapor deposition, physical vapor deposition, ion implantation, metrology, rapid thermal processing, dry stripping and combinations thereof.

It should be understood that the foregoing description is only illustrative of the disclosure. Various alternatives and modifications can be devised by those skilled in the art without departing from the disclosure. Accordingly, the present disclosure is intended to embrace all such alternatives, modifications and variances which fall within the scope of the appended claims.

The invention claimed is:

1. A substrate transport apparatus for a substrate processing tool, the transport apparatus comprising:
   a drive section;
   a movable arm operably connected to the drive section;
   an end effector connected to the moveable arm for holding and transporting a substrate in the processing tool; and
   a substrate inertial capture edge grip connected to the end effector and arranged so that the grip effects capture and centering of the substrate onto the end effector from substrate inertia.

2. The apparatus according to claim 1, wherein the grip is defined by the end effector including asymmetric front and rear contact pads on an end effector blade for contacting the perimeter of the substrate, the asymmetric front and rear contact pads each having substrate contact surfaces defining asymmetrically angled substrate contact planes; and
   a controller connected to the drive section the controller being programmed to move the movable arm so that substrate inertia generates movement between the substrate and at least one of the contact pads for centering and capturing the substrate.

3. The apparatus according to claim 2, wherein the controller is programmed to position the end effector to pick the substrate in an eccentric position on the contact surfaces of the front and rear pads.

4. The apparatus of claim 2, wherein the front and rear pads comprise two front pads and a rear pad.

5. The apparatus of claim 2, wherein the end effector blade is fork-shaped.

6. The apparatus of claim 5, wherein the two front pads are incorporated within each end effector blade tip.

7. The apparatus of claim 2, wherein the end effector blade is paddle-shaped.

8. The apparatus of claim 4, wherein each of the two front pads comprise two or more angled substrate contact surfaces, at least on of which is a substrate ramp, and the rear pad includes one or more substrate ramp surfaces.

9. The apparatus of claim 8, wherein the at least one substrate ramp is angled at a compound relative to a horizontal plane arranged to bias substrate movement for centering the substrate.

10. The apparatus of claim 6, wherein the one rear pad has a first wedge-shape for capturing a trailing edge of the substrate, and a second wedge shape different than the first wedge shape.

11. The apparatus of claim 2, wherein the asymmetric front and rear contact pads arranged so that the contact surfaces generate an unbalanced force against the substrate biasing the substrate in a predetermined direction.

12. The apparatus of claim 1, wherein the end effector has a substrate mapper for mapping substrates in a holding station of the processing tool, and wherein the substrate mapper detects presence of the substrate held by the inertial capture edge grip.

13. The apparatus of claim 12, wherein the substrate mapper comprises a thru beam sensor for sensing substrates, the sensor being a common sensor for substrate mapping and presence detection.

14. A flat work piece transport apparatus for transporting a flat work piece, the apparatus comprising:
    a drive section including a drive shaft;
    at least one movable arm connected to the drive shaft; and
    at least one end effector connected to the at least one movable arm, wherein the at least one end effector includes asymmetric front and rear pads mounted to an end effector blade for supporting a perimeter of the flat work piece, at least one of the asymmetric front rear pads having asymmetric work piece support surfaces relative to another of the front and rear pads, and at least one end effector includes a beam sensor mounted within the end effector blade for mapping a workpiece holding station, and for detecting and positioning the flat work piece on the asymmetric front and rear pads;
    wherein the asymmetry of the front and rear pads defines a skewed and eccentric position for the flat work piece on the support surfaces of the front and rear pads, and causes simultaneous centering and capture of the flat work piece on the at least one end effector when the flat work piece is displaced by inertia from the skewed and eccentric position.

15. The apparatus in claim 14, further comprising one or more controllers for coordinating the drive section, the at least one movable arm, the at least one end effector and the thru beam sensors to effect inertial capture and centering of the flat work piece on the at least one end effector.

16. The apparatus of claim 14 wherein the asymmetric front and rear pads include two front pads and one rear pad, and wherein the at least one end effector comprises two or more substantially parallel end effectors, each of which has the asymmetric front and rear pads.

17. The apparatus of claim 16, wherein each end effector blade is fork-shaped.

18. The apparatus of claim 16, wherein the two front pads comprise two or more angled support surfaces and the one rear pad includes one or more angled support surfaces.

19. The apparatus of claim 14, wherein the inertial displacement for center and capture of the flat work piece on the end effector is provided by acceleration movement of the at least one end effector.

20. A semiconductor tool station comprising the apparatus of claim 14.

21. The apparatus of claim 16, wherein the rear pad is mounted to the end effector blade via a spring loaded adjustment mechanism.

22. A method of transporting a flat work piece comprising:
    providing a flat work piece transport apparatus comprising a drive shaft, a movable arm connected to the drive shaft, an end effector connected to the moveable arm, wherein the end effector includes asymmetric front and rear pads mounted to the end effector blade and a thru beam sensor mounted within the end effector blade, and a controller for coordinating the drive section, the moveable arm, the end effector and the thru beam sensor;
    mapping with the thru beam sensor the position of the flat work piece in a work piece holding station relative to a predetermined position;
    picking up the flat work piece with the end effector in a skewed and eccentric position on the support surfaces of the front and rear pads of the end effector blade; and
    moving the end effector to inertially displace the flat work piece from the skewed and eccentric position, to the asymmetric front and rear pads operating on the flat work piece when inertially displaced to simultaneously center and capture the flat work piece on the end effector.

* * * * *